United States Patent

Sagara et al.

[11] 3,932,865
[45] Jan. 13, 1976

[54] ANALOG-TO-DIGITAL CONVERTER

[75] Inventors: Iwao Sagara; Hirohisa Shishikura; Ikuo Anada, all of Tokyo, Japan

[73] Assignee: Oki Electric Industry Company, Ltd., Tokyo, Japan

[22] Filed: May 22, 1974

[21] Appl. No.: 472,480

[30] Foreign Application Priority Data
May 25, 1973 Japan............................ 48-57841
May 25, 1973 Japan............................ 48-57844

[52] U.S. Cl. ........................................ 340/347 AD
[51] Int. Cl.² .................................... H03K 13/02
[58] Field of Search ............ 340/347 AD; 324/99 D

[56] References Cited
UNITED STATES PATENTS

| | | | |
|---|---|---|---|
| 2,592,308 | 4/1952 | Meacham ..................... | 340/347 AD |
| 2,688,441 | 9/1954 | Merrill et al. ................. | 340/347 AD |
| 2,781,970 | 2/1957 | Kaufman ..................... | 340/347 AD |
| 2,838,663 | 6/1958 | Goldberg ..................... | 340/347 AD |
| 3,187,323 | 6/1965 | Flood et al. ................... | 340/347 AD |
| 3,286,232 | 11/1966 | Stanford ...................... | 340/347 AD |
| 3,337,722 | 8/1967 | Siess et al. ................... | 340/347 AD |

*Primary Examiner*—Charles D. Miller
*Attorney, Agent, or Firm*—Armstrong, Nikaido & Wegner

[57] ABSTRACT

An accurate, simple and compact analog-to-digital converter has been found. The converter comprises

- a voltage divider circuit including a plurality of stepped voltage dividing points separated by a plurality of resistors for dividing the input voltage received from the analog input terminal;
- a group of switches for receiving said divided voltages; and
- a switching decision circuit for determining the amplitude of the voltage from a decision point through said switch group, the output of said decision circuit being applied to a logic circuit to provide digital signal output.

3 Claims, 9 Drawing Figures

ANALOG-TO-DIGITAL CONVERTER

DETAILED DESCRIPTION OF THE INVENTION

The present invention relates to a simple, rapid and high-precision analog-digital converter circuit.

Generally, the well-known analog-digital (A/D) converter circuit may be included in two systems: the sequential comparison system and the system utilizing corona charging and discharging phenomena, such as an integration system and the like. Whereas the sequential comparison system permits A/D conversion of high precision and quality, it must have a digital-analog (D/A) converter circuit within itself as well as a feedback loop as an associated circuit, making circuit construction complicated and requiring considerable care to be paid to the set up of the circuit conditions. On the other hand, in the system utilizing the corona charging and discharging phenomena, it has been essentially impossible to stably maintain high precision in A/D conversion. Further, since the A/D converter circuit is basically a circuit which receives analog input signals and delivers digital output signals, systems such as the above have produced A/D converter circuits with the drawback in that the circuit elements or portions of digital function and the circuit elements or portions of analog function in such circuits may require complex relations. Moreover, such conventional A/D converter circuits have required elaborate matching of the circuit elements and it was impossible to make the circuit as a large scale integration on a single substrate. Any A/D converter circuit according to either of the above systems, for example, necessitates an analog signal voltage comparator circuit, which disturbs circuit integration with other digital circuit elements. This does not meet the requirements for accommodating electronic circuits such as an A/D converter circuit, etc., in products like cameras, time-pieces, etc., which have extremely limited space for the essential components.

The conventional A/D converter circuit has another disadvantage in that since the discrete signal values which are usable as the specific signals are limited, for example, it may be extremely difficult or impossible to adopt the discrete signal values with irregular intervals therebetween, or it may not be possible to employ the circuit technique of effecting A/D conversion through the discrimination of input analog signal in logarithmic relation.

As described above, no conventional A/D converter circuit to date has been free of various drawbacks and none have acheived satisfactory performance. Accordingly, the object of the present invention is to eliminate such drawbacks as mentioned above which are peculiar to the conventional converter circuit, by maintaining high conversion precision and quality, simplifying the circuit composition especially in the A/D converter circuit of small capacity, and by coordinating the circuitry with the digital circuit element side to facilitate the matching of circuit elements and thus, to enable circuit integration into LSI circuit and the like, as well as by making it possible to select any discrete signal values as required.

The present invention will now be further described with reference to the accompanying drawings.

Figure 1:
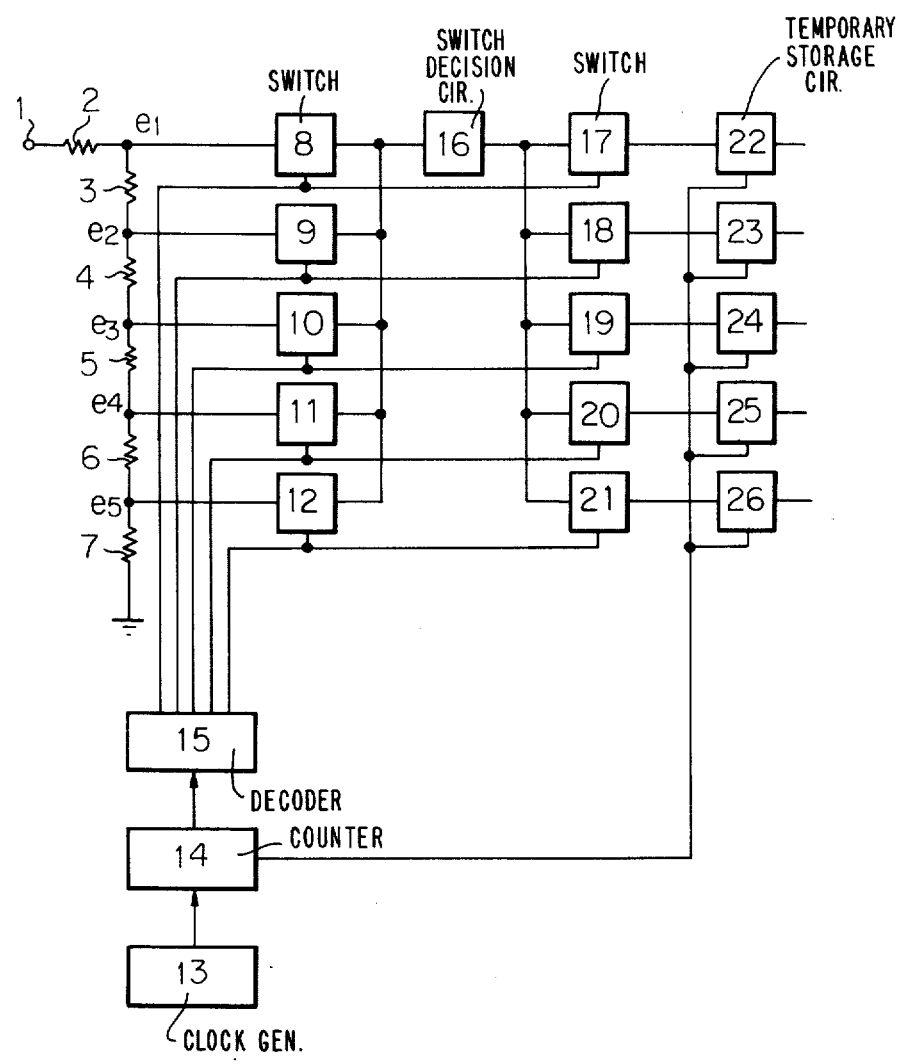
FIG. 1 shows schematically the principle embodiment of the A/D converter circuit according to the present invention.

Referring to FIG. 1 illustrating the principle embodiment of the present invention, reference numeral 1 indicates the analog signal input terminal; reference numerals 2, 3, 4, 5, 6 and 7 indicate the resistances composing the voltage divider circuit; 8 through 12, indicate the switches to which signals are supplied from each resistance of the voltage divider circuit to transmit the signals and are provided with control terminals; 13, indicates the clock generator circuit; 14, the counter for the clock pulses from said generator; 15, the decoder to selectively control said switches 8 through 12 depending on the counting of the clock pulses; 16, the switching decision circuit to determine the divided voltage signals transmitted through said switches 8 through 12; 17, 18, 19, 20 and 21 indicate the switches controllable as timed with said switches 8 through 12 to transmit the resulting signal from the decision circuit 16; 22, 23, 24, 25 and 26 indicate the temporary storage circuits, e.g., flip-flop circuits, for temporarily storing the resulting decision signal transmitted through said switches 17 through 21 by appropriate clock signals supplied from said counter 14.

The operation of the principle embodiment shown in FIG. 1 will be described in detail hereinbelow; first, the analog voltage signal applied to the analog signal input terminal 1 is divided by the voltage divider circuit comprised of the resistances. The divided voltages $e1$, $e2$, $e3$, $e4$ and $e5$ are applied to the respective switches 8 through 12 while the clock output from the clock generator circuit 13 is counted by the counter 14 and the control output of the decoder 15 is operated in response to the counting to select any one of the switches. Said control output will turn on only one of the switches. Accordingly, when the count is "0", for example, only the switch 8 of said switch group 8 to 12 may be turned on and when the count is 1, the control output turns on only the switch 9 and in a similar manner, only the switch 10 will be turned on for the count of 2, only the switch 11 for the count 3, and only the switch 12 will be turned on when the count is 4. Thus, the switch group is controlled by the control circuit, but of course, it is possible to select the sequence in which the switch is to be turned on. Now, it is assumed that only the switch 8 is first turned on as described above and the divided voltage $e1$ is applied to the switching decision circuit 16, then the voltage $e2$ is applied to the decision circuit 16 with only the switch 9 turned on and the voltages $e3$, $e4$, $e5$, ... are sequentially applied to the decision circuit similarly as above when the switch is switched on each time the counter counts the clock. The decision circuit permits effecting one of four possible inversions depending on the set conditions. That is, when the input voltage is at a higher level (to be referred to as "1" level hereinafter) than a predetermined decision voltage (to be referred to as "threshold voltage" hereinafter), the decision circuit may decide either to invert the output voltage into a higher level voltage (to be similarly referred to as 1 level hereinafter) or to invert the input voltage into a lower level voltage (to be referred to as 0 level hereinafter), depending on the set-up conditions. Similarly, the decision circuit may decide either to invert the output voltage into the 1 level or to invert it into the 0 level depending on the circuit build-up conditions, if the input voltage is at lower level (0 level) than the threshold voltage.

We will now consider the case in which the decision circuit 16 is set to invert the output into 0 level when the input is at 0 level. To the input of the decision circuit 16 are applied signal voltages $e1$, $e2$, $e3$, $e4$ and $e5$, in this order. In this case, since the signal voltage $e1$ is higher than $e2$, $e2$ is higher than $e3$, ..., that is, $e1>e2>e3>e4>e5$ due to the property of the voltage divider circuit, the decision circuit 16 will proceed in the decision sequence from a higher voltage to a lower voltage. In the decision process, it is only when the input voltage applied to the decision circuit 16 is below the threshold voltage that the circuit 16 will provide the output at 0 level and continue to give the 0 level output thereafter. For example, in the case where the analog input voltage is such that all the signal voltages $e1$ through $e5$ are lower than the threshold voltage of decision circuit 16, the output from the circuit 16 is always at 0 level, accordingly all of the outputs from the switches 17 through 21 will be at 0 level so that the 0 level is stored equally in the flip-flp circuits 22 through 26. The decision circuit 16 provides the output of 1 level only when the switch is on if the analog input voltage applied to the analog signal terminal is stepped up to produce the signal voltage $e1$ at 1 level, however, the output from the decision circuit 16 will be at 0 level in case the other switch is turned on even under the same conditions as above. The switches 17 through 21 are arranged to be turned on as timed to the switches 8 through 12, respectively, resulting in the appearance of the 1 level signal at the output of the flip-flop 21 alone depending upon only the output of the switch 17. Similarly, with the signal voltages $e1$ and $e2$ being at 1 level, the flip-flop circuits 22 and 23 will provide outputs of 1 level, and when the signal voltage $e3$ as well as the above voltages $e1$ and $e2$ are at 1 level, the outputs of the flip-flop circuits 22, 23 and 24 will also be at 1 level. Finally, when the signal voltages $e1$ through $e5$ are all at 1 level, all the outputs of the flip-flop circuits 22 through 26 will be at 1 level. This means that the signal states of flip-flop circuits 22 through 26 may be varied depending on the level of the discrete decision point in which the analog signal voltage falls.

Five decision points have been placed in the present embodiment of the present invention, although the number of the decision points may be increased by increasing the number of voltage dividing resistors, switches and temporary storage circuits utilized in such a converter circuit. Naturally, increasing the number of decision points will provide an A/D converser circuit of high discrimination precision. Also, by selecting any value for each resistance used in the voltage divider circuit, any value may be selectable for the interval between the discrimination decision points.

Figure 2:
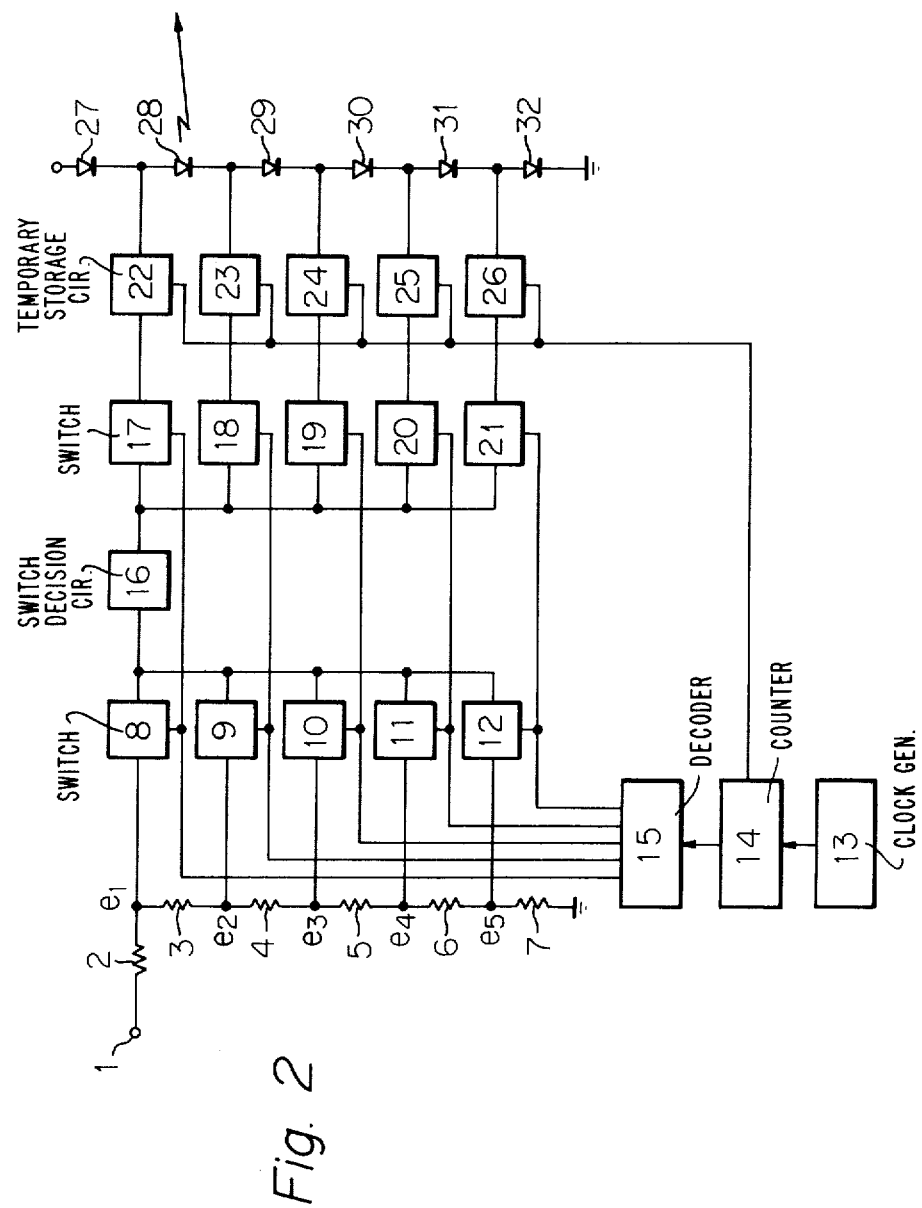
FIGS. 2 through 6 are circuit diagrams of the practical embodiments of FIG. 1.

The practical embodiments of FIG. 1 are illustrated in FIGS. 2 through 6. Referring to FIG. 2, now, the reference numerals 27, 28, 29, 30, 31 and 32 indicate light-emitting diodes (LED) utilized as a display means, which is selectively actuated corresponding to the decision points of the level changed as described above from 1 to 0 between two outputs adjacent to one another of the flip-flop circuits 22 through 26, that is, only the diode which corresponds to the analog input voltage value is actuated. When the outputs of flip-flop circuits 22 through 26 are all at 0 level, only the LED 27 is selected to be actuated while the LED 32 alone is actuated when the outputs of the flip-flop circuits 22 through 26 are all at 1 level. Thus, the LED 27 and 32 will show that the input voltage is larger than the upper limit or below the lower limit of the A/D converter.

Figure 3:
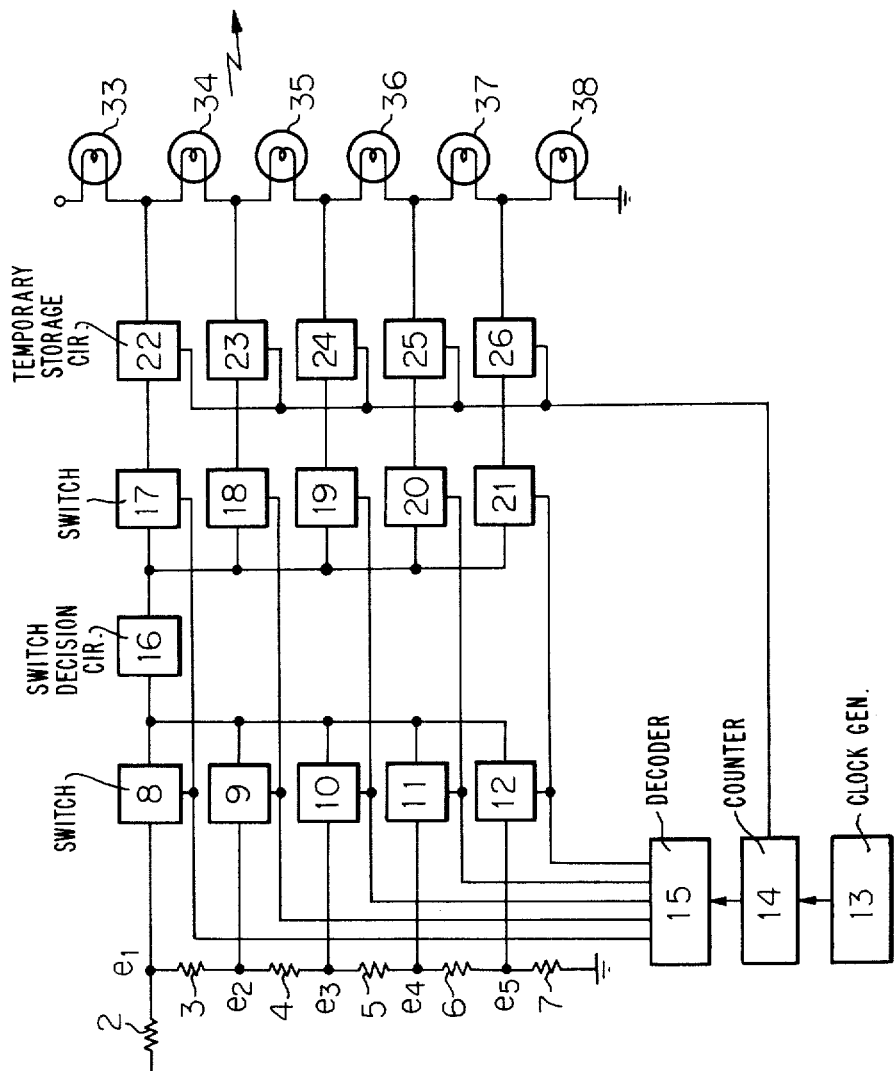

In FIG. 3, the reference numerals 33, 34, 35, 36, 37 and 38 indicate tungsten lamps, the displaying functions of which are the same as the LEDs employed in the example shown in FIG. 2.

Figure 4:
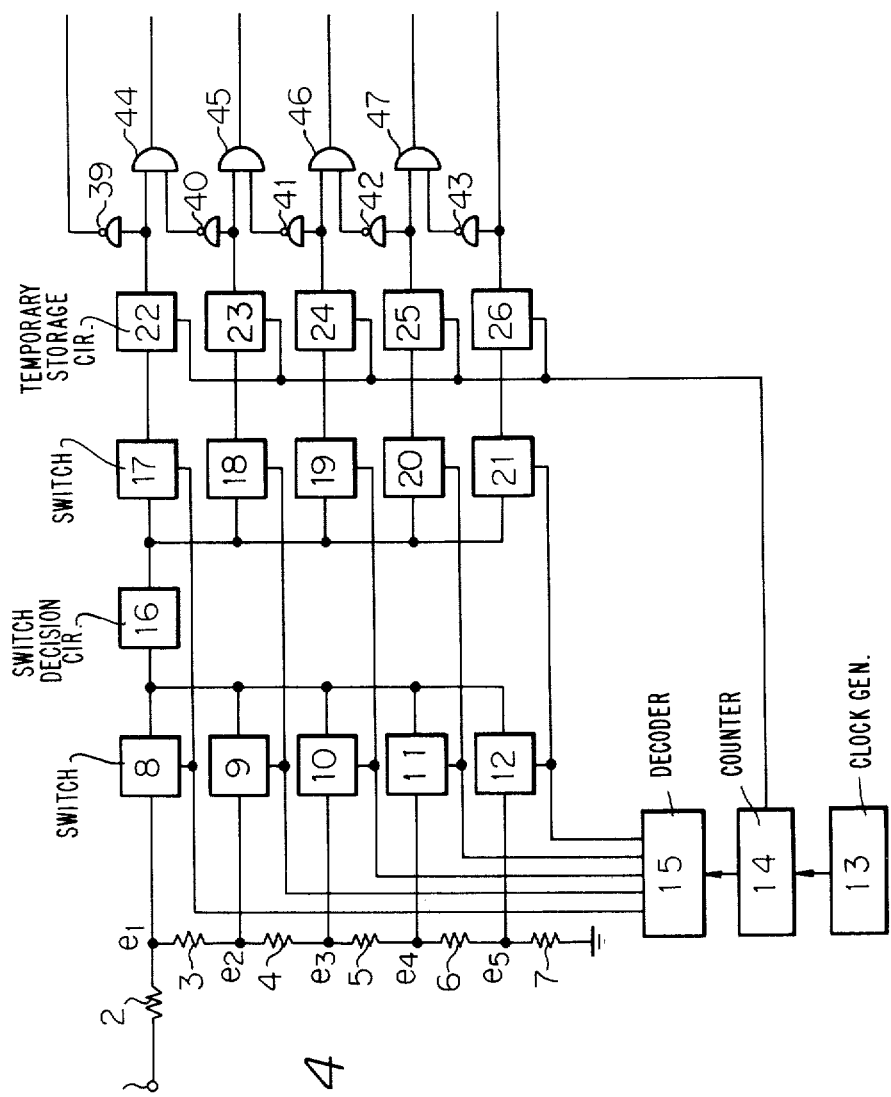

Referring to FIG. 4 showing a further embodiment, the reference numerals 39 through 43 indicate inverter logic elements 44 through 47 show AND logic elements. In this example, when only the output of the flip-flop 22 is at 1 level and the outputs of remaining flip-flop circuits 24 through 26 are all at 0 level, only the output of AND logic element 44 is at 1 level while the outputs of other AND logic elements are at 0 level. Further, when the outputs of flip-flop circuits 22 and 23 are both at 1 level and the outputs of other flip-flop circuits 24 through 26 are all at 0 level, it is only the output of AND logic element 45 that becomes 1 level. Accordingly, it will be understood that it is only the output corresponding to the input analog voltage value that will be selected to be at 1 level. Of course, such a logic element permits conductivity beyond the upper limit and below the lower limit. This is the case in which the circuit is arranged so that as the input signal value is increased, the outputs of flip-flop circuits 22 through 26 will be at 1 level in the sequence beginning from the greater output value. On the other hand, where the converter circuit is arranged so that the flip-flop circuit outputs are converted to 1 level in the sequence beginning from the smaller output value the similar function as those described before may be provided by modifying the arrangement of the inverter circuit.

Figure 5:
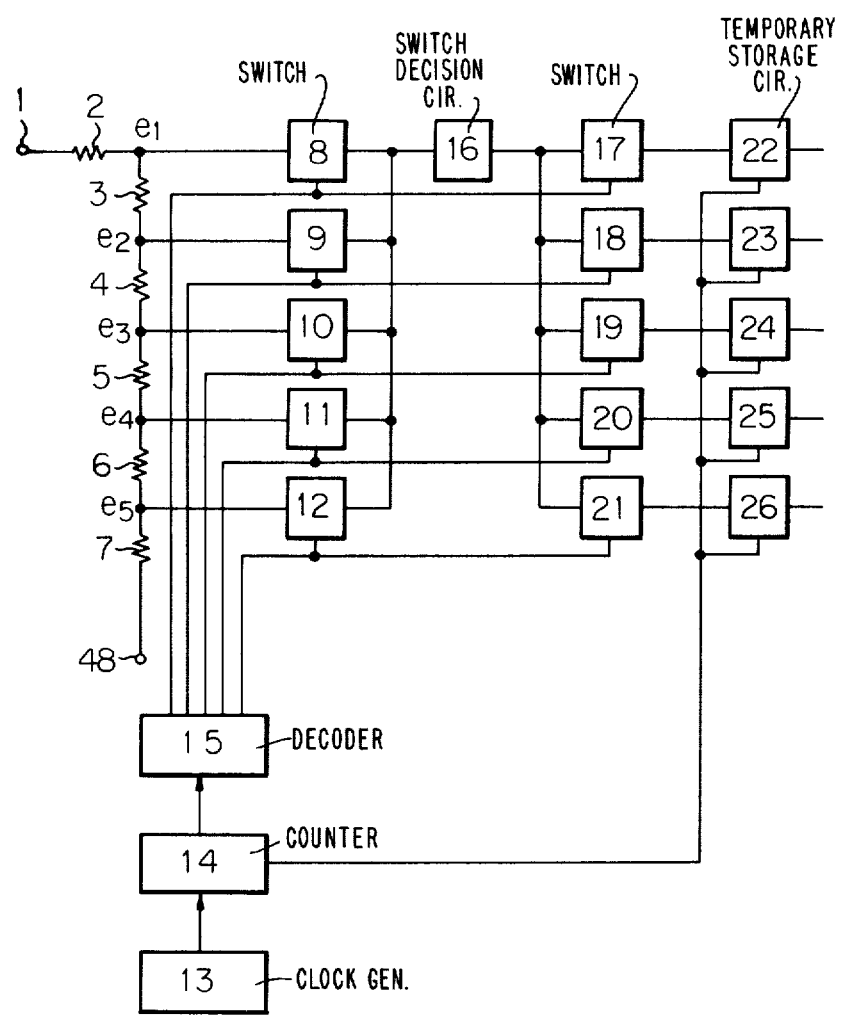
Figure 6:
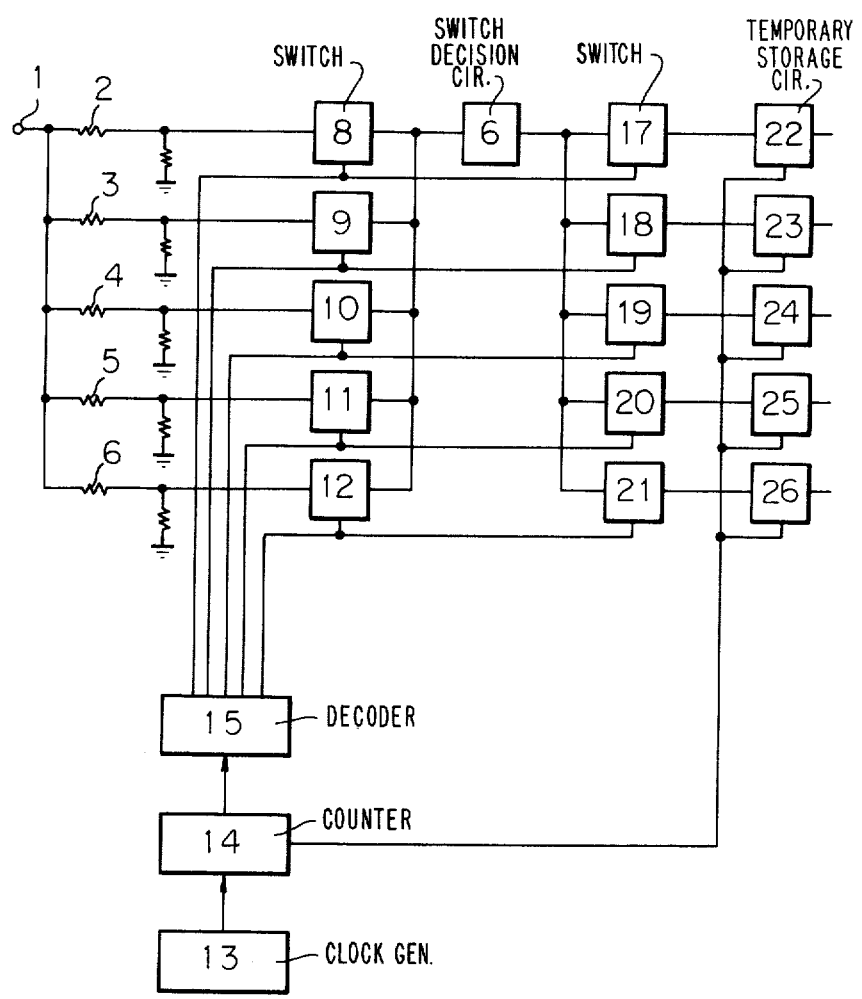

The other terminal of the resistance type voltage divider circuit has been connected to the ground in the examples described with reference to FIGS. 2, 3 and 4. In FIG. 5 said terminal may be applied with any selected voltage from the external terminal 48. In this case, the discrete decision points can be set to any value by selecting the proper voltage for application to the external terminal 48. Further, it is possible to construct the resistance type voltage divider circuit like that shown in FIG. 6. The possible variation shown in FIG. 6 has the resistances parallelly arranged at each level from the analog signal input terminal 1, whereby the divided voltage of the input signal may be adjusted to any value by changing the value of said resistance.

Figure 7:
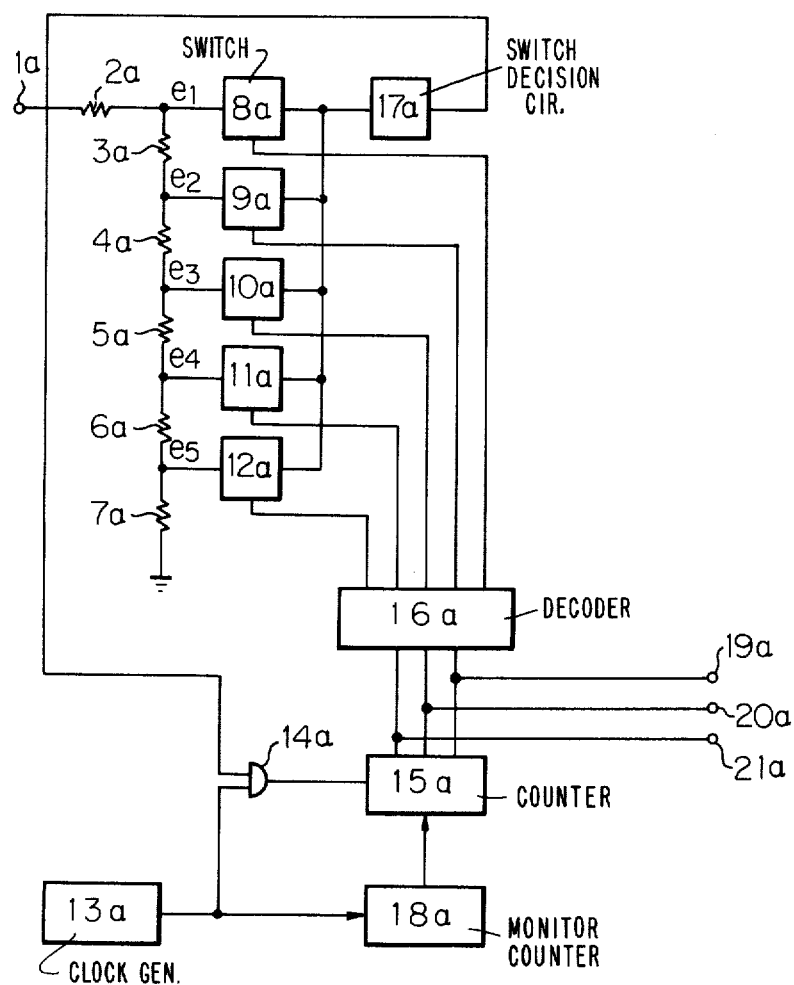
FIG. 7 shows schematically the other principle embodiment of the A/D converter circuit according to the present invention.

FIG. 7 shows the other principle embodiment of the present invention. In FIG. 7, reference number $1a$ indicates an analog signal input terminal, $2a$, $3a$, $4a$, $5a$, $6a$ and $7a$ indicate resistors for a voltage divider, $8a$, $9a$, $10a$, $11a$ and $12a$ indicate switches connected to said resistors, $13a$ a clock generator, $14a$ a gate circuit for controlling a clock signal, $15a$ a counter for counting the number of clock pulses controlled by said gate circuit $14a$, $16a$ indicates a decoder for selecting one of switches $8a$ through $12a$ according to the content of said counter $15a$ and $17a$ indicates a switching decision circuit for comparing the voltages from switches $8a$, $9a$, $10a$, $11a$ and $12a$ with the predetermined value. The output of said switching decision circuit $17a$ is connected to the input of said gate circuit 14, the output of which controls the clock signal. $18a$ indicates a monitor counter having the function of clearing the counter $15a$.

Now, the operation of the A/D converter of FIG. 7 will be explained. An analog voltage applied to terminal 1a is divided into a plurality of stepping voltages by divider resistors 2a through 7a. The divided voltages $e1, e2, e3, e4$ and $e5$ are applied to the related switches 8a, 9a, 10a, 11a and 12a, respectively. On the other hand, a clock signal generated by the clock generator 13a is applied to the counter 15a through the gate circuit 14a. The counter 15a, which comprises for instance, three binary bits, counts the number of pulses of said clock signal, and the decoder 16a selects and turns on one of switches 8a, 9a, 10a, 11a or 12a according to the content of said counter 15a. For instance, when the content of said counter 15a is zero, the switch 8a is turned on, and when the content is 1, 2, 3 or 4, corresponding switch 9a, 10a, 11a or 12a is turned on. As mentioned above, the switches 8a through 12a are controlled on the time divisional basis, and the operational sequence of the switches can be arbitrarily determined.

It is assumed that voltage $e1, e2, e3, e4$ or $e5$ is applied to the input of the decision circuit 17a when the content of the counter 15a is 0, 1, 2, 3, 4 or 5, respectively. In the embodiment of FIG. 7, the inequality $e1>e2>e3>e4>e5$ is satisfied, and the larger the content of the counter 15a, the smaller the voltage the decision circuit 17a receives.

The decision circuit 17a functions to decide four kinds of conditions according to the set control of said decision circuit 17a. That is to say, when the input voltage to the decision circuit 17a is higher than a predetermined value (which will be referred to as a threshold value hereinafter), the decision circuit 17a provides an output voltage of a high level (1 level) or low level (0 level) according to the set control. Similarly, when the input voltage to the decision circuit 17a is lower than the threshold value, the decision circuit 17a provides an output signal of 1 level or 0 level according to the set control.

It is assumed that the decision circuit 17a is set to provide a 0 or 1 output signal according to a 0 or 1 input signal, respectively, by the set control. The decision circuit 17a receives signals $e1, e2, e3, e4$ and $e5$ in this order. That is to say, the decision circuit 17a deals first with the larger voltage. If the input voltage to the decision circuit 17a is larger at first than the threshold value, the decision circuit 17a provides an output signal of 1 level. However, since the input voltage decreases during the operational process, said input voltage to the decision circuit 17a becomes smaller than the threshold value, and the decision circuit 17a provides a zero output signal. The zero output signal of the decision circuit 17a closes the gate circuit 14a, and the clock signal to the counter 15a is inhibited. Accordingly, the content of the counter 15a in its steady state corresponds to an amplitude of the analog input voltage if the divider resistors 2a through 7a are properly designed. For instance, when an analog input voltage in which $e1$ and $e2$ relate to 1 level and $e3$ through $e5$ relate to zero level, is applied to the input terminal 1a, the content of the counter 15a changes from 0 to 1 and 2 in turn. However, when said content is 2, the switch 10a turns on, voltage $e3$ is applied to the input of the decision circuit 17a, and the output of the decision circuit 17a changes to zero. Thus, the gate circuit 14a is closed and the content of the counter 15a remains at 2. When the counter 15a stops, its content depends of course, upon the amplitude of analog input signals and said content shows a value of the analog input voltage. The monitor counter 18a functions to clear the counter 15a repetitively for the succeeding A/D conversion.

An output digital signal is obtained from the counter 15a, at output terminals 19a, 20a and 21a.

The accuracy of the A/D converter of FIG. 7 can be improved by using many divider resistors and their related switches.

Figure 8:
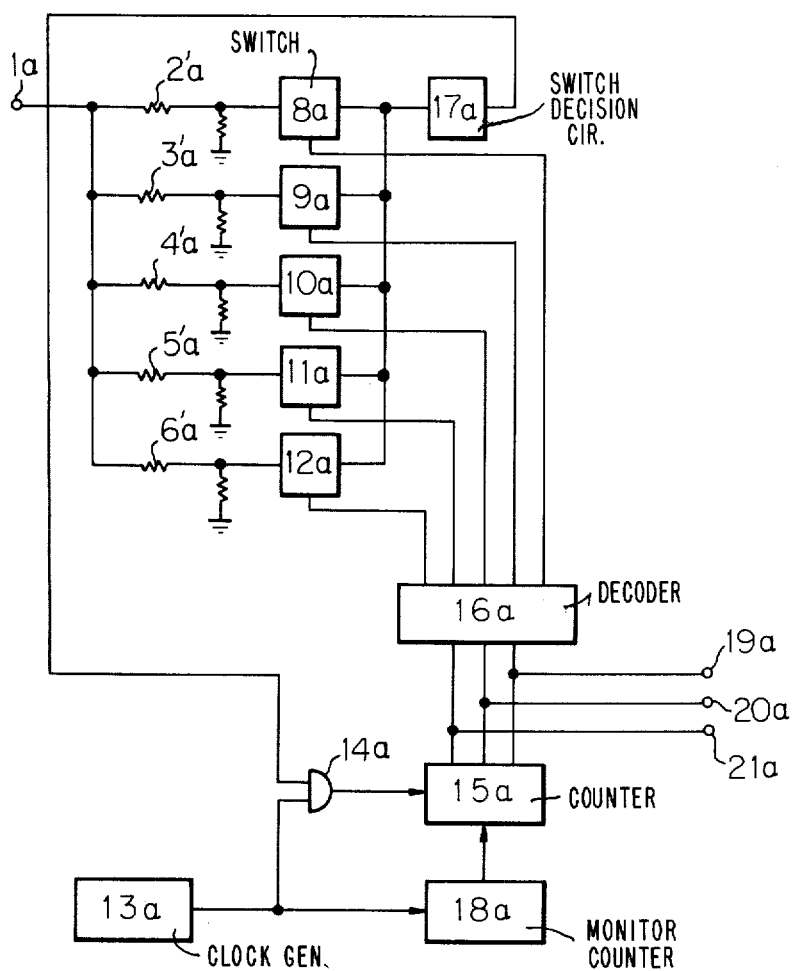
FIG. 8 and FIG. 9 are circuit diagrams of the practical embodiments of FIG. 4.

FIG. 8 shows one modification of FIG. 7. In FIG. 8 resistors $2'a, 3'a, 4'a, 5'a$ and $6'a$ are connected between the input terminal 1a and each of switches 8a through 12a instead of to series connected resistors 2a through 7a of FIG. 7. According to the embodiment of FIG. 8, the input voltage to the decision circuit 17a can be determined arbitrarily by appropriate choice of values of resistors $2'a$ through $6'a$.

Figure 9:
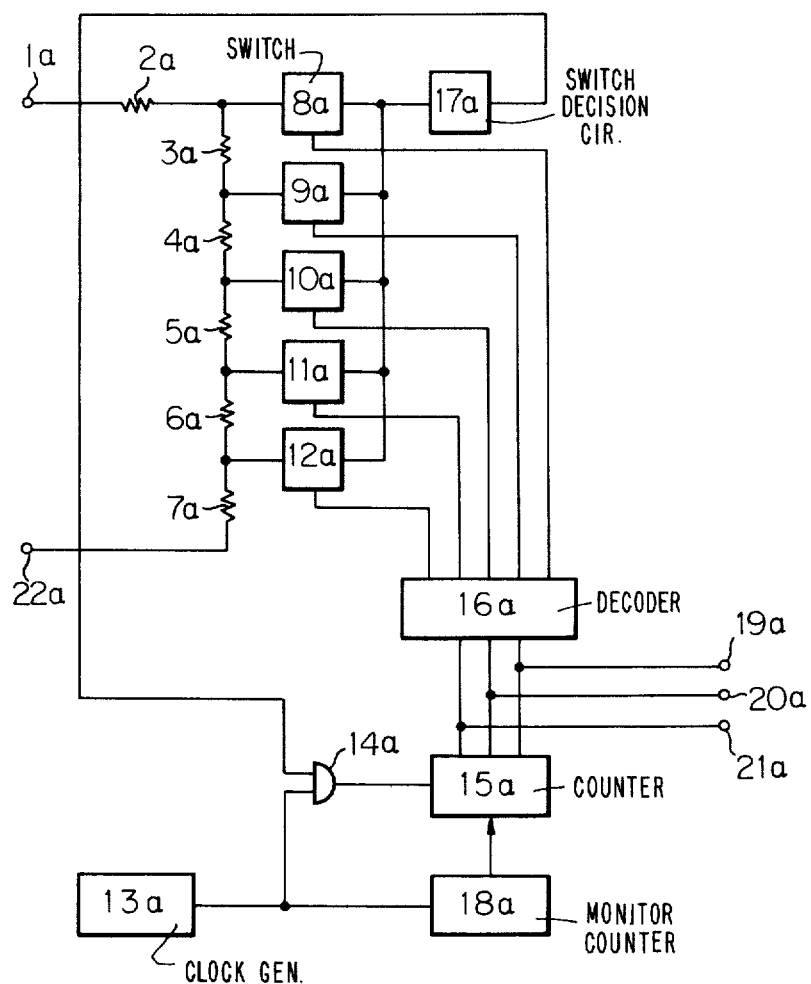

FIG. 9 shows the other modification of FIG. 7. In FIG. 9, one terminal of the divider resistors of the resistor 7a is not connected to the ground but is connected to terminal 22, which receives a predetermined voltage. The appropriate choice of a value of said predetermined voltage provides an arbitrary voltage, even negative voltage, at the input of the decision circuit 17a.

The A/D conversion circuit according to the present invention has been explained in detail through the description of the principle and practical embodiments by way of example, which have the advantage of providing a simple and compact circuit utilizing the resistance type voltage divider circuit, switches, and switching decision circuit, based on a novel circuit technique which has been not attained by the conventional A/D converter circuit. Many other advantages permit the set-up of a number of discrete discrimination points and their intervals as well as levels, etc., for effective use of the novel A/D conversion circuit.

From the foregoing, it will now be apparent that a new and improved A/D converter has been created. It should be understood, of course, that the embodiments disclosed are merely illustrative and are not intended to limit the scope of this invention.

Finally, a list of important reference numbers used to indicate parts of FIG. 1 and FIG. 7 in this specification is given below.

| | |
|---|---|
| 1, | analog signal input terminal |
| 2 through 7, | voltage divider resistance |
| 8 through 12, | switch |
| 13, | clock generator |
| 14, | counter |
| 15, | decoder |
| 16, | switching decision circuit |
| 17 through 21, | switch |
| 22 through 26, | temporary storage circuit |
| 1a, | analog signal input terminal |
| 2a through 7a, | voltage divider resistance |
| 8a through 12a, | switch |
| 13a, | clock generator |
| 14a, | gate circuit |
| 15a, | counter |
| 16a, | decoder |
| 17a, | switching decision circuit |
| 18a, | monitor counter |
| 19a, 20a, 21a, | output terminal |

What is claimed is:

1. An analog-digital converter circuit for converting an analog voltage input to a digital output comprising:
   a. voltage divider means, said voltage input being applied across said voltage divider means, said voltage divider means producing a plurality of voltages having amplitudes related to said input voltage;
b. a plurality of first switch means, each first switch means being coupled to said voltage divider means;
c. control means coupled to each of said switch means for sequentially closing said first switch means in a predetermined sequence;
d. switching decision means coupled to said first switch means, wherein when each first switch means is closed, the voltage at the point in said voltage divider means to which the first switch means is coupled is applied to said switching decision means, said switching decision means comparing the amplitude of the voltage applied thereto to a predetermined voltage and producing a first output if the amplitude of the applied voltage is greater than the predetermined voltage and producing a second voltage if the amplitude of the applied voltage is less than the predetermined voltage; and
e. output means coupled to said switching decision means for providing an indication of whether the output of said switching decision means is said first output or said second output.

2. The analog-digital converter of claim 1, wherein said output means includes:
a. a plurality of second switch means coupled to said switching decision means, each second switch means being coupled to said control means and sequentially closed thereby, each said second switch means being closed simultaneously with a corresponding first switch means;
b. a plurality of temporary storage means, one of said storage means being coupled to said switching decision means when a corresponding second switch means is closed, whereby the output of said switching decision means is stored in said storage means; and
c. indicator means for providing an indication of the output stored in said storage means.

3. An analog-digital converter circuit for converting an analog voltage input to a digital output comprising:
a. voltage divider means, said voltage input being applied across said voltage divider means;
b. a plurality of switch means, each switch means being coupled to said voltage divider means, said switch means being sequentially closed;
c. switching decision means coupled to said switch means, wherein when each of said switch means is closed, the voltage at the point in said voltage divider means to which the switch means is coupled is applied to said switching decision means, said switching decision means comparing the amplitude of the voltage applied thereto to a predetermined voltage and producing a first output if the amplitude of the applied voltage is greater than the predetermined voltage and producing a second voltage if the amplitude of the applied voltage is less than the predetermined voltage;
d. clock generator means for generating clock pulses;
e. gate means having its input coupled to the output of said switch decision means and said clock generating means;
f. counter means coupled to the output of said gate means, said counter means producing an output indicative of the digital output of said switching decision means; and
g. decoder means coupled to said counter means, the output of said decoder means being coupled to said switch means for sequentially closing said switch means.

* * * * *